United States Patent
Wachnik et al.

(10) Patent No.: US 6,531,759 B2
(45) Date of Patent: Mar. 11, 2003

(54) ALPHA PARTICLE SHIELD FOR INTEGRATED CIRCUIT

(75) Inventors: Richard A. Wachnik, Mount Kisco, NY (US); Henry A. Nye, III, Brookfield, CT (US); Charles R. Davis, Fishkill, NY (US); Theodore H. Zabel, Yorktown Heights, NY (US); Phillip J. Restle, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/777,540

(22) Filed: Feb. 6, 2001

(65) Prior Publication Data

US 2002/0105059 A1 Aug. 8, 2002

(51) Int. Cl.[7] .............................................. H01L 23/552
(52) U.S. Cl. ...................... 257/659; 257/660; 257/642; 257/643; 438/82; 438/725
(58) Field of Search ................................. 257/659, 660, 257/642, 643, 546; 174/35; 357/51, 54, 68; 365/53, 149; 29/591

(56) References Cited

U.S. PATENT DOCUMENTS

| 4,323,405 A | * | 4/1982 | Uno et al. ..................... 156/64 |
| 4,423,548 A | | 1/1984 | Hulsewch |
| 4,510,050 A | | 4/1985 | Parlman et al. |
| 4,519,050 A | | 5/1985 | Folmsbee |
| 4,530,074 A | | 7/1985 | Folsmbee |
| 4,656,055 A | | 4/1987 | Dwyer |
| 4,853,894 A | * | 8/1989 | Yamanaka et al. .......... 365/154 |
| 4,947,235 A | | 8/1990 | Roth et al. |
| 4,975,762 A | | 12/1990 | Stradley |
| 5,053,848 A | * | 10/1991 | Houston et al. ............... 357/51 |
| 5,324,982 A | | 6/1994 | Nakazato et al. |
| 5,391,915 A | | 2/1995 | Mukai et al. |
| 5,805,494 A | | 9/1998 | El-Kareh et al. |
| 5,999,440 A | | 12/1999 | Crafts |
| 6,043,429 A | | 3/2000 | Blish, II et al. |

OTHER PUBLICATIONS

IBM Technical Disclosure Bulletin,80A 05436, Alpha Particle Shield, Oct. 1980, pp. 1892–1893.

* cited by examiner

Primary Examiner—Matthew Smith
Assistant Examiner—B V Keshavan
(74) Attorney, Agent, or Firm—Joseph P. Abate

(57) ABSTRACT

An integrated circuit, comprising: a semiconductor substrate, a plurality of last metal conductors disposed above said substrate, a bottom metallic layer disposed on said last metal conductors, a top metallic layer, and an alpha absorber disposed between said bottom and top metallic layers, said alpha absorber consisting essentially of a high-purity metal which is an alpha-particle absorber. The metal is, for example, of Ta, W, Re, Os or Ir.

6 Claims, 3 Drawing Sheets

ALPHA PARTICLE SHIELD FOR INTEGRATED CIRCUIT

TECHNICAL FIELD

The present invention relates to alpha particle absorbers, and more particularly to such absorbers for integrated circuits.

DESCRIPTION OF THE RELEVANT ART

Integrated circuits are susceptible to alpha particles which may cause single event upsets or soft errors. As is well known, the alpha particles are commonly emitted by the metals, ceramics and other materials associated with a next level of assembly of an integrated circuit.

Alpha particle shields for integrated circuits are also known. See, for example, U.S. Pat. No. 6,043,429, METHOD OF MAKING FLIP CHIP PACKAGES, issued Mar. 28, 2000 by Blish, et al. and IBM TECHNICAL DISCLOSURE BULLETIN, 80A 05436, Alpha Particle Shield, pp. 1892–1893, October 1980, which are both incorporated in their entireties herein by reference. Organic shields for alpha particles are also known.

The present inventors believe that improvements in alpha particle shields are achievable. According to the present invention, an integrated circuit includes a semiconductor substrate, a plurality of last metal conductors disposed above the substrate, a bottom metallic layer disposed on the last metal conductors, a top metallic layer, and an alpha absorber disposed between the bottom and top metallic layers, the alpha absorber consisting essentially of a high-purity metal which is a good alpha-particle absorber and a very low alpha particle emitter.

In other words, a cap metallurgy which is typically used atop a final passivation of an integrated circuit is modified to include a high-alpha-absorption low-emission metallurgy.

Figure 1:
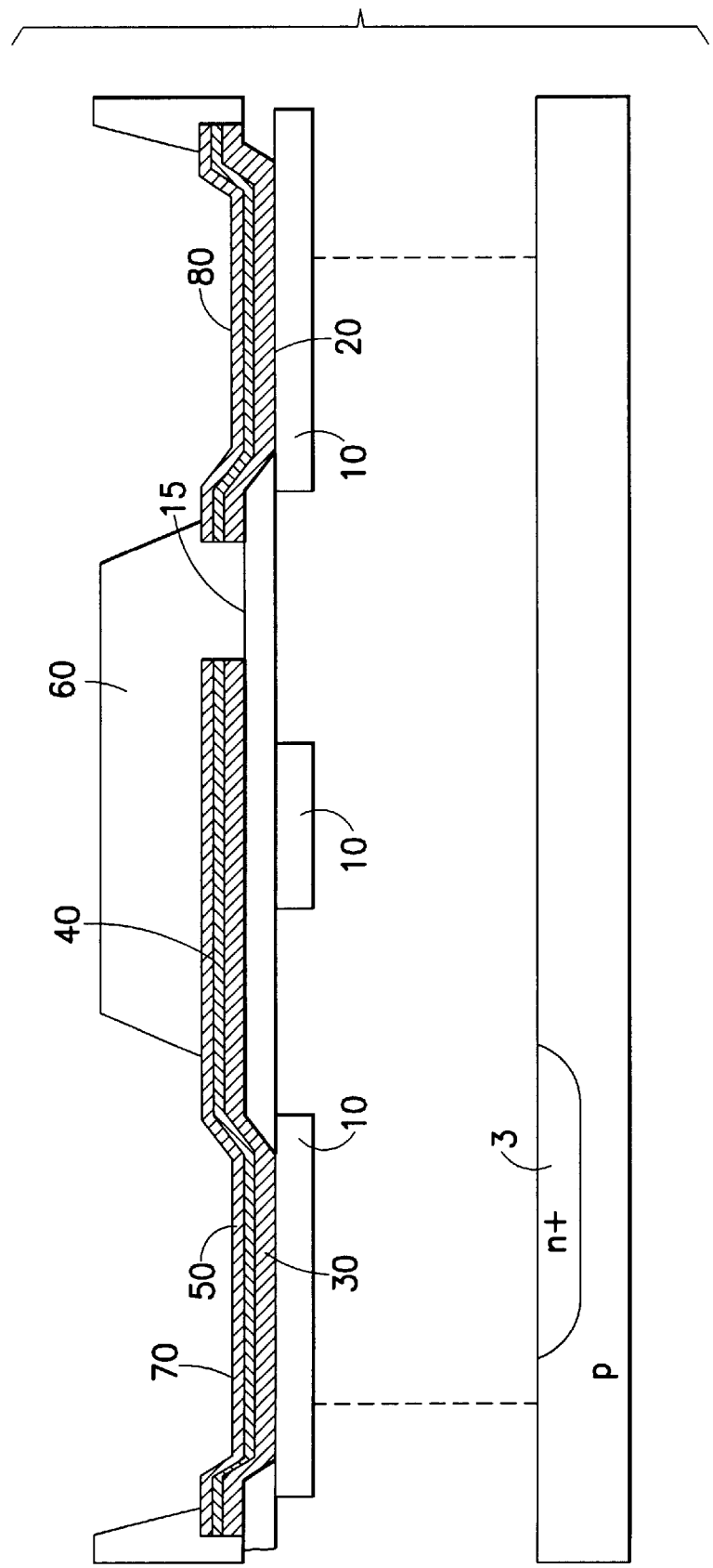
FIG. 1 is a side-schematic view of a simplified integrated circuit including an alpha particle absorber according to the present invention.
Figure 2:
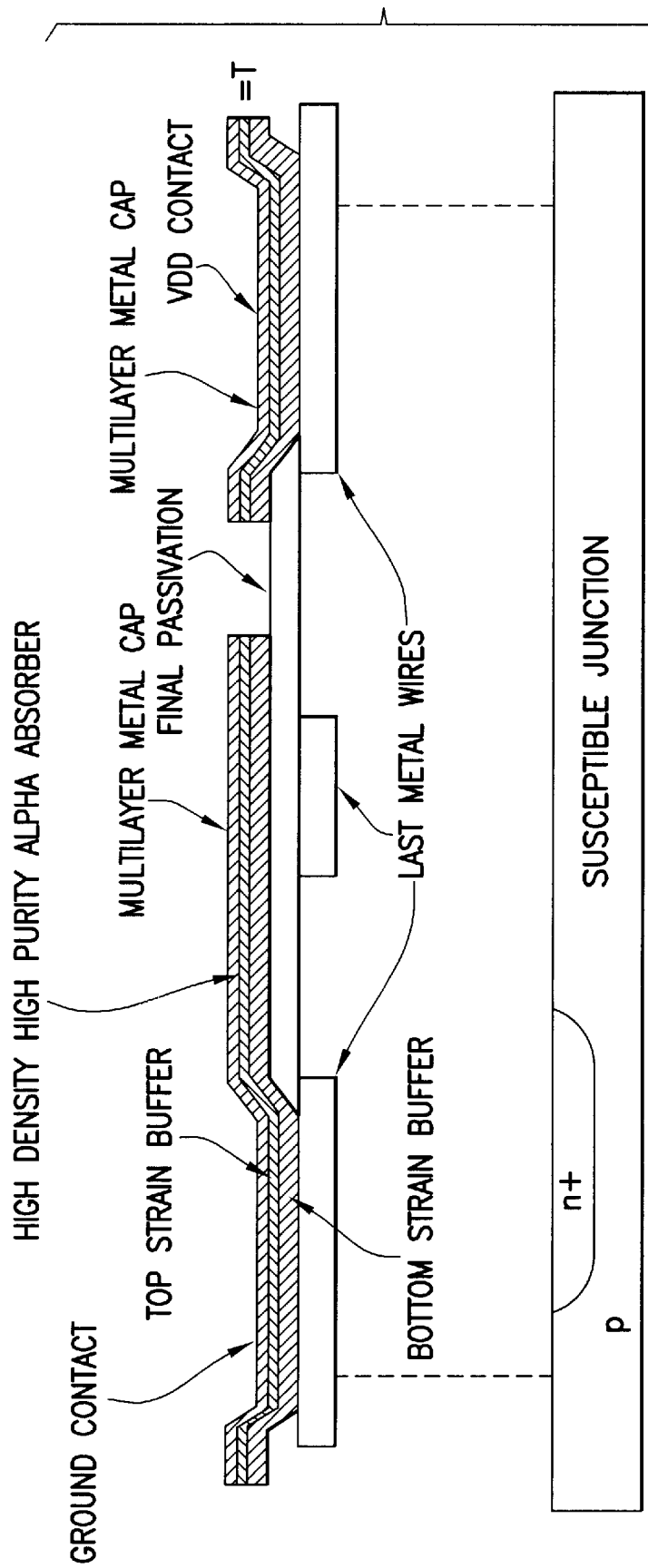
FIG. 2 is a side-schematic view similar to FIG. 1, with descriptive labels.
Figure 3:
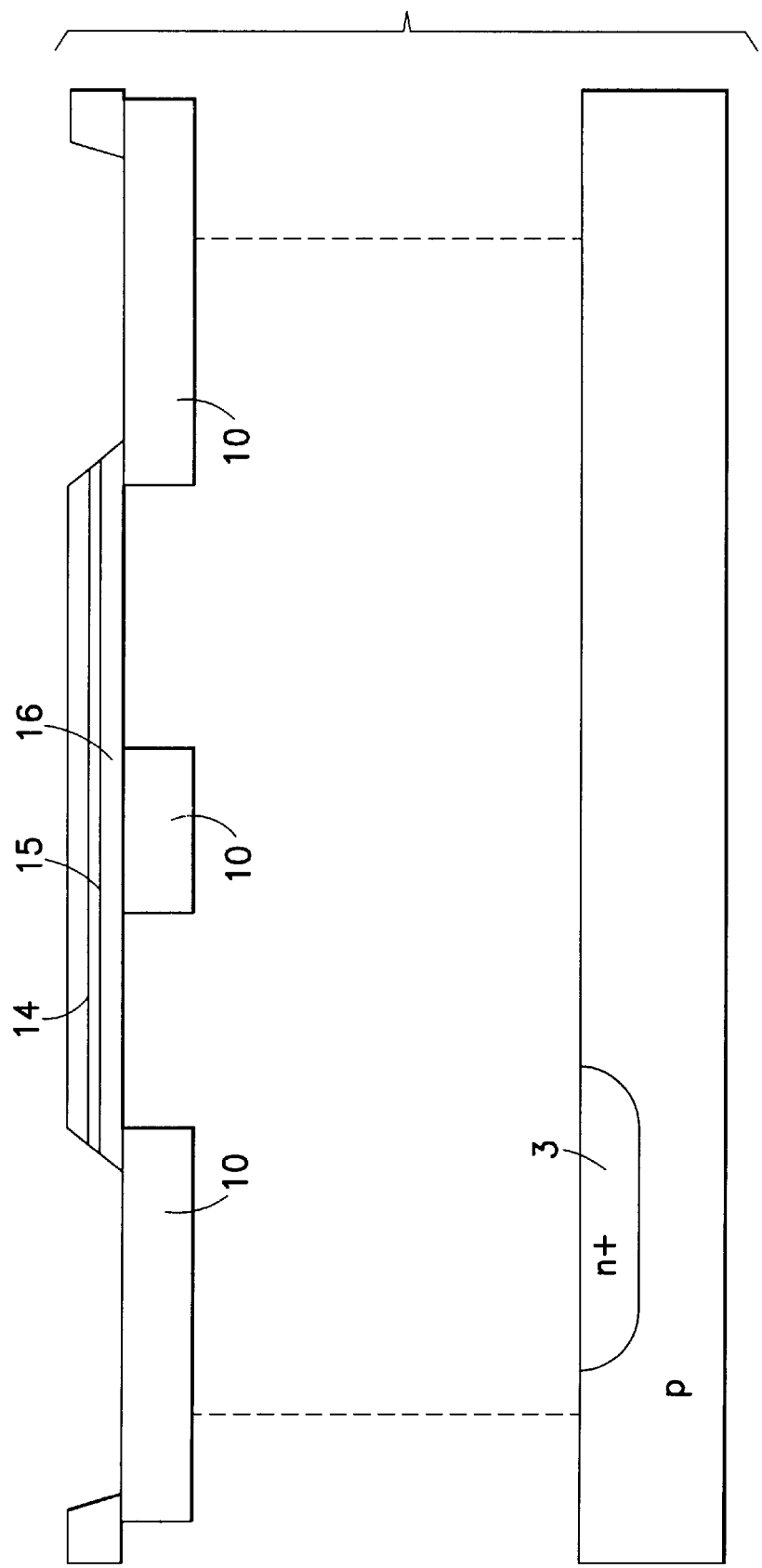
FIG. 3 is a side-schematic view similar to FIG. 1, explaining intermediate steps for achieving the inventive structure shown in FIGS. 1 and 2.

In the FIGS. 1, 2 and 3, dashed lines schematically represent the physical connection of the substrate to the remainder of the inventive circuit, as would be understood by those skilled in the art.

DETAILED DESCRIPTION OF THE PREFERRED EMBODIMENT AND BEST MODE

As shown in FIG. 1, the present invention integrates a highly absorbing low alpha particle emission metal layer 40 into a final passivation and terminal metallurgy of an integrated circuit. Aluminum layers 30, 50 provide adhesion and strain buffer layers. An aluminum layer is also transparent to many existing terminal metallurgy processes. The constraints on the choice of metal for the absorbing layer are relaxed by the use of the buffer layer 30 and selection depends primarily on the nuclear properties. These are absorption of alpha particles, absence or minimization of nuclear emissions or fragments which would generate soft errors or single event upset.

The high-purity alpha-particle absorbing non-emitting or low emitting material (metal) may be chosen from the materials Ta, W, Re, Os, or Ir. Other metals or combinations of metal may also be used if they meet the requirements of high purity, no or low alpha-particle emission, and high alpha-particle-absorption. The layer should be of uniform thickness and be at least 1000 Å thick and less than 10 microns thick.

The aluminum layer 30 may be replaced by other metals which have good adhesion to $SiO_2$, $SiN_x$, and flow at low stresses to provide stress relief between the final passivation, the alpha absorbing layer and the top polyimide passivation or terminal metallurgy. The bottom aluminum layer 30 should be of uniform thickness and be between 0.01 microns and 2 microns thick, the top aluminum layer 50 should be of uniform thickness and be between 0.01 microns to 2 microns thick.

A polyimide or other organic based layer 60 may be deposited and patterned on the top strain buffer layer 50. The actual terminal metallurgy (for example C4) can be built on top of this patterned layer or the patterned polyimide layer above it.

The layers are deposited sequentially as shown and then patterned using standard lithographic techniques. It is possible to deposit and then pattern each layer independently, but this is less desirable. The layers should be patterned to cover as much of the chip (IC) consistent with the requirements of separate power and ground planes as well as I/O terminals. Features such as fuse bays and optical inspection windows can be opened during the patterning step.

Creating integrated circuits (without the present inventive absorber) using single or dual damascene or substantially etched metal processes are well known. See, eg, U.S. Pat. Nos.: 6,093,508, 6,051,882 and 6,140,226, which are all incorporated in their entireties by reference herein. Accordingly, only aspects of IC manufacture necessary to understand and implement the present invention will be discussed.

Various processes may be used to manufacture the present invention.

Process Sequence of a Preferred Embodiment

This process sequence begins at the last layer of wiring 10 which may be formed using a damascene, dual damascene, or subtractively etched metal.

A. For Dual Damascene Last Metal (10)

1) Deposit cap layer 14 of Si3N4 (eg, use a Novellus Concept tool with SiH4+NH3); See FIG. 3.
2) Deposit 450 nm Silane Oxide layer 15 or similar oxide (Tool: Novellus Concept PECVD).
   2A) Deposit 450 nm Silane Oxide or
   2B) Deposit Silane oxide of thickness equal to or more than minimum space, to minimize capacitance.
3) Deposit 400 nm SiN4 layer 16 Plasma Enhance Chemical Vapor Deposition using Silane and NH3 or High Density Plasma oxide using Silane and NH3 (Novellus Concept).
4) Spin on resist (eg, TOK 3250, a mid UV photoresist).
5) Photo lithography to pattern final via which contacts metal 10.
6) Etch final via opening 20 down to underlying metal land 10. For this process flow, the upper most copper layer 10 would be exposed. (Use, eg, LAM 4520XL PECVD tool with CF4+O2 RIE). See FIGS. 1 and 2.

7) Deposit strain buffer 30, corrosion resistant metal, preferably Al or Al(0.5% Cu). The metals should be sputtered and may be deposited using an Endura 5500 sputter tool.

6A1) Deposit 25 nm Ti

6A2) Deposit 25 nm TiN

6A3) deposit 500 nm–1500 nm aluminum with 1200 nm preferred.

8) Deposit an alpha-particle absorber 40, Ta, W, Re, Os, or Ir. For W, deposit between 1 um and 9 um using CVD tungsten on Novellus Concept.

9) Deposit second strain buffer 50, 0.5–1.5 um of Al or Al(0.5%Cu) using AMAT Endura 5500 tool.

10) TD (30, 40, 50) resist and lithography.

11) TD (terminal deposition) etch.

12) Spin on Polyimide 60 and cure at 350° C. for 1 hour.

13) Pattern FV (final via in polyimide) opening.

14) Deposit ball limiting metallurgy (BLM).

Either

14A1) PVD deposition of Chromium, Chromium phased with copper and copper

14A2) Spin on RISTON (Dupont resist)—thick dry process resist—and pattern using photolithography techniques which are well known.

14A3) Electroplate Pb(Sn) solder

14A4) Strip resist

14A5) Wet or dry etch of BLM using electroplated solder as a mask

Or

14B1) overlay molybdenum mask

14B2) Use Physical vapor deposition to deposit Chromium, Chromium phased with copper, copper and gold;

14B3) Evaporate Pb(Sn) alloy onto masked wafer;

14B4) Finish patterning by lift off of molybdenum mask.

B. For Subtractive Etched Metal (eg Al(Cu))

1) Deposit PECVD TEOS dielectric with good gap fill (Novellus Concept or AMAT Producer using dual frequency);

2) Planarize using oxide CMP;

3) Follow dual damascene process flow starting with Si3N4 deposition in step 3 of dual damascene process flow.

This alpha shield provides several advantages over known alpha shields:

1) Protection against low energy alpha particles;

2) Ground plane for return of current on high frequency nets—this reduces inductance and improves variation in delay;

3) Thermal equipotential which allows high power cirouits;

4) Items 2) and 3) result in an effective improvement in wiring density since wiring tracks are not lost to electrical and thermal isolation requirements;

5) The extended film provides enhanced resistance to mechanical damage;

6) There is a slight enhancement in decoupling from power Vdd wires to the extended TD ground plane.

What is claimed is:

1. An integrated circuit comprising:

a semiconductor substate, a plurality of last metal conductors disposed above said substrate, a bottom metallic layer disposed on and electrical contacting said last metal conductors, a top metallic layer, and an alpha absorber disposed between said bottom and top metallic layers, said alpha absorber consisting essentially of a high-purity metal which is an alpha-particle absorber.

2. The integrated circuit as claimed in claim 1, wherein said metal is a metal selected from the group consisting of Ta, W, Re, Os and Ir.

3. The integrated circuit as claimed in claim 2, wherein said metallic layers consist essentially of aluminum.

4. The integrated circuit as claimed in claim 2, wherein said alpha absorber is a layer having a substantially uniform thickness (T).

5. The integrated circuit as claimed in claim 2, wherein each of said bottom metallic and said top metallic layer has a respective substantially uniform thickness.

6. The integrated circuit as claimed in claim 4, wherein said substantially uniform thickness (T) is a thickness in a range of $1000 \text{ Å} \leq T < 10$ microns.

* * * * *